United States Patent [19]
Gaku et al.

[11] Patent Number: 4,554,346
[45] Date of Patent: Nov. 19, 1985

[54] PREPARATION OF CURABLE RESIN FROM CYANATE ESTER COMPOUND

[75] Inventors: Morio Gaku, Saitama; Hidenori Kimbara; Jun Yokoi, both of Tokyo, all of Japan

[73] Assignee: Mitsubishi Gas Chemical Company, Inc., Tokyo, Japan

[21] Appl. No.: 633,035

[22] Filed: Jul. 18, 1984

[30] Foreign Application Priority Data

Jul. 22, 1983 [JP]  Japan ................................ 58-134025

[51] Int. Cl.$^4$ ............................................. C08G 83/00
[52] U.S. Cl. .................................... 528/363; 525/523; 525/531; 525/533; 528/271; 528/422; 428/411.1; 428/704
[58] Field of Search ........................ 528/363, 271, 422

[56] References Cited

U.S. PATENT DOCUMENTS 4,373,086  2/1983  Ikeguchi ............................. 528/363
4,383,903  5/1983  Ayano et al. ................... 204/159.16
4,393,195  7/1983  Gaku et al. ......................... 528/361

Primary Examiner—Harold D. Anderson
Attorney, Agent, or Firm—Browdy and Neimark

[57] ABSTRACT

A process for producing a curable resin which comprises reacting (a) at least one cyanate ester compound selected from the group consisting of polyfunctional cyanate esters having two or more cyanato groups per one molecule, prepolymers of the cyanate esters or mixtures thereof with (b) at least one compound having hydroxy group(s) and radical-polymerizable unsaturated double bond(s) in its molecule, the cyanate ester compound (a) and the compound (b) being used so that the ratio of the cyanato group to the hydroxy is in the range of from about 1:0.1 to about 1:2, in the presence of (c) a radical polymerization inhibitor at a temperature of about 80°–about 140° C.

The curable resin produced according to the present invention is capable of giving cured products having excellent heat resistance and electrical properties.

7 Claims, No Drawings

PREPARATION OF CURABLE RESIN FROM CYANATE ESTER COMPOUND

BACKGROUND OF THE INVENTION

The present invention relates to a novel process for producing a curable resin.

In the prior art, it was known to cure a mixture of (a) a cyanate ester or prepolymer of the cyanate ester and (b) photo-polymerizable or photo-crosslinkable monomer or prepolymer of the monomer by heating the mixture or by means of radiation.

However, the degree of radical-polymerizability or photo-polymerizability of the cyanate ester itself is small. Even when it has been attempted to radical-polymerize or photo-cure the cyanate ester, the cyanate ester could not be completely radical-polymerized or photo-cured. The resulting cured cyanate ester was non-uniform.

SUMMARY OF THE INVENTION

It was known that the resin obtained by curing a cyanate ester or prepolymer of the cyanate ester has excellent thermal-resistance or electrical properties. The present inventors have carried out research for preparing cyanate ester-containing resin capable of being easily radical-polymerized or photo-cured in order to utilize such excellent thermal-resistance and electrical properties of the cured cyanate ester resin.

An object of this invention is to provide a process for producing a cyanate ester-containing resin capable of being easily radical-polymerized or photo-cured to form a cured cyanate ester component-resin having excellent properties.

Another object of this invention is to provide a process for producing a curable resin capable of giving a cured resin having much higher heat resistance and more uniformity than the prior art cyanate ester or prepolymer thereof.

This invention relates to a process for producing a curable resin which comprises reacting (a) at least one cyanate ester compound selected from the group consisting of polyfunctional cyanate esters having two or more cyanato groups per one molecule, prepolymers of the cyanate esters or mixtures thereof, with (b) at least one compound having hydroxy group(s) and radical-polymerizable unsaturated double bond(s) in its molecule, wherein the cyanate ester compound (a) and the compound (b) are used so that the ratio of the cyanato group to the hydroxy group is in the range of from about 1:0.1 to about 1:2, in the presence of (c) a radical polymerization inhibitor at a temperature of about 80°–about 140° C.

DETAILED DESCRIPTION OF THE INVENTION

The reaction mechanism of this invention is as follows: According to this invention, the cyanato groups of the cyanate ester compound (a) selectively react with the hydroxy groups of the compound (b) while suppressing reaction between the cyanato groups of the cyanate ester compound (a) and the double bond of the compound (b) as little as possible.

The ratio of the cyanato group of the cyanate ester compound (a) to the hydroxy group of the compound (b) is in the range of from about 1:0.1 to about 1:2, and preferably from about 1:0.2 to about 1:1.

The reaction temperature and the reaction time depend on the amount and particulars of impurities contained in the reactants.

The reaction temperature is in the range of from about 80° to about 140° C., and preferably from about 95° to about 125° C. The reaction time may be in the range of from about 2 to about 36 hours, and preferably from about 3 to about 15 hours.

When the reaction temperature is less than 80° C., the reaction between the cyanato group and the hydroxy group occurs insufficiently, and therefore, the cyanate ester compound (a) and the compound (b) change into a gel form and the two components become separated into two phases. When the reaction temperature is more than 140° C., the cyanate ester compound (a) and the compound (b) are likely to change into a gel form. That is, the two compounds (a) and (b) gel before uniform material is formed.

The reaction between the cyanate ester compound (a) and the compound (b) is effected in the presence of a radical polymerization inhibitor and in the presence or absence of a solvent continuously or batchwise.

The forms of the curable resin obtained by reacting the compounds (a) and (b) depend on particulars and amounts of the two compounds (a) and (b), and the presence or absence of a solvent. When no solvent is employed, the resulting curable resin is a viscous, clear liquid and contains the unreacted components, self-condensate of each of the compounds (a) and (b), and the materials in which 1, 3 or 5 units of the compound (a) and at least one unit of the compound (b) are bonded to each other.

The proportion of the reaction product of (a) and (b) in the curable resin and the reactivity of compound (b) depend on the reaction temperature, the reaction time, and particulars and purities of compounds (a) and (b) employed. When 2-hydroxyethyl methacrylate is employed as the compound (b), a viscous liquid can be obtained by reacting 1 mol of compound (a) with as little as 0.15 mol of 2-hydroxyethyl methacrylate. The cured product obtained by curing the viscous, clear liquid has better thermal resistance, better clarity and more uniformity than the cured product obtained by a control run not using the present process.

When the curable resin produced according to the present invention alone is cured by heating it or by exposing it to radiation, the resulting cured product has excellent properties. The curable resin can be used as it is. Alternatively, the curable resin can be concentrated at reduced pressure and 20°–105° C. to remove all or a part of the solvent, lower molecular weight substances, such as the unreacted compound (b) and lower boiling point substances. The resulting curable resin which is liquid at room temperature or paste can be used in the next step.

The curable resin composition of this invention produced according to the above-mentioned process can be photo-cured or heat-cured as it is. Alternatively, the curable resin composition may be blended with (d) a photo-polymerization initiator or a photo-sensitizer, or (e) a heat-curing catalyst or a curing agent.

The blend of curable resin composition of this invention and component (d) or (e) can be cured by means of radiation, heat, radiation and heat or electron beam.

By "polyfunctional cyanate ester" is meant a compound having at least two cyanate groups in its molecule. The polyfunctional cyanate ester is represented by the formula $$R^1\text{−O−}(C\equiv N)_m$$

wherein $R^1$ is an aromatic nucleus-containing residue having 1–10 benzene rings selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

wherein $R^2$ and $R^3$ are the same or different and each represents a hydrogen atom or an alkyl group containing 1 to 4 carbon atoms,

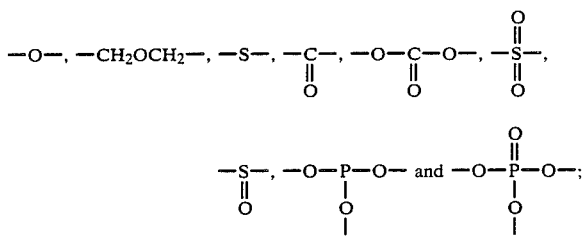

said aromatic nucleus is optionally substituted by a substituent selected from the group consisting of alkyl groups containing 1 to 4 carbon atoms, alkoxy groups containing 1 to 4 carbon atoms, chlorine and bromine; m is in an integer of at least 2 and preferably 2–10, and the cyanate group is always directly bonded to the aromatic nucleus.

Examples of the polyfunctional cyanate ester include 1,3- or 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane, 2,2-bis(3,5-dichloro-4-cyanatophenyl)propane, 2,2-bis(3,5-dibromo-4-cyanatophenyl)propane; bis(4-cyanatophenyl)ether; bis(4-cyanatophenyl)thioether; bis(4-cyanatophenyl)sulfone; tris(4-cyanatophenyl)phosphite; tris(4-cyanatophenyl)phosphate; bis(3-chloro-4-cyanatophenyl)methane; cyanated novolak derived from novolak (U.S. Pat. No. 4,022,755, U.S. Pat. No. 3,448,079 etc.); cyanated bisphenol type polycarbonate oligomer derived from bisphenol type polycarbonate oligomer (U.S. Pat. No. 4,026,913) and mixture thereof. Other cyanate esters employed in the practice of this invention are given in U.S. Pat. Nos. 3,553,244; 3,755,402; 3,740,348, 3,595,900; 3,694,410 and 4,116,946 and BP Nos. 1,305,967 and 1,060,933 which are incorporated herein by reference. Of these cyanate esters, divalent cyanate ester compounds which are derived from divalent phenols, have symmetric structure and do not have any condensed ring in their bridging portion, such as, for example, 2,2-bis(4-hydroxyphenyl)propane, are preferable, because they are commercially available and give cured product having excellent properties. Polycyanate compounds obtained by reacting a phenol-formaldehyde precondensate with a halogenated cyanide are also satisfactory. The above-mentioned cyanate esters may be used as mixtures.

Prepolymers may be used containing a sym-triazine ring which is prepared by the trimerization of the cyanate groups of the cyanate ester, and which have a number average molecular weight of 300 to 6,000. Such prepolymers can be prepared by polymerizing the above cyanate esters in the presence or absence of, as a catalyst, an acid such as a mineral acid or Lewis acid, a base such as sodium hydroxide, a sodium alcoholate or a tertiary amine, a salt such as sodium carbonate or lithirium chloride, or phosphate esters, such as tributyl phosphine.

The polyfunctional cyanate ester can be used in the form of a mixture of the monomer and the prepolymer. For example, many of the commercially available cyanate esters derived from bisphenol A and cyanogen halide are in the form of mixtures of cyanate monomers and prepolymers, and such materials can also be used in the present invention. A coprepolymer of the cyanate ester and an amine may be used as the cyanate ester component.

It is preferable that the compound (b) has one hydroxy group and at least one radical-polymerizable unsaturated double bond in its molecule. The compounds having the acryloyl or methacryloyl group are more preferable as a compound (b). Examples of compounds (b) include hydroxyalkyl acrylates or methacrylates, such as hydroxyethyl acrylate or methacrylate, hydroxypropyl acrylate or methacrylate, 2-hydroxybutyl acrylate or methacrylate, 2-hydroxyoctyl acrylate or methacrylate, 2-hydroxydodecyl acrylate or methacrylate, 2-hyroxy-3-chloropropyl acrylate or methacrylate, 2-hydroxy-3-acryloxypropyl acrylate or methacrylate, 2-hydroxy-3-methacryloxypropyl acrylate or methacrylate, 2-hydroxy-3-acetoxypropyl acrylate or methacrylate, 2-hydroxy-3-chloroacetoxypropyl acrylate or methacrylate, 2-hydroxy-3-dichloroacetoxypropyl acrylate or methacrylate, 2-hydroxy-3-trichloroacetoxypropyl acrylate or methacrylate, and 2-hydroxy-3-allyloxypropyl acrylate or methacrylate; esters of aliphatic polyhydroxy compounds and acrylic acid or methacrylic acid, such as diethylene glycol monoacrylate or monomethacrylate, triethylene glycol monoacrylate or monomethacrylate, tetraethylene glycol monoacrylate or monomethacrylate, neopentyl glycol monoacrylate or monoethacrylate, trimethylolethane monoacrylate or monomethacrylate, trimethylolethane diacrylate or dimethacrylate, trimethlolpropane monoacrylate or monomethacrylate, trimethylolpropane diacrylate or dimethacrylate, glycerol monoacrylate or monomethacrylate, glycerol diacrylate or dimethacrylate, pentaerythritol monoacrylate or monomethacrylate, pentaerythritol diacrylate or dimethacrylate, and pentaerythritol triacrylate or trimethacrylate; esters of aromatic polyhydroxy compounds and acrylic acid or methacrylic acid, such as hydroquinone monoacrylate or monomethacrylate, resorcin monoacrylate or monomethacrylate, cathecol monoacrylate or monomethacrylate, and pyrogallol monoacrylate or monomethacrylate; polyalkylene glycol monoacrylates or monomethacrylates, such as tris(2-hydroxyethyl)isocyanurate diacrylate, polyethylene glycol monoacrylate or monomethacrylate, and polypropylene glycol monoacrylate or monomethacrylate; monoacrylates or monomethacrylates of bisphenol A-alkylene oxide addition product, such as monoacrylate or monomethacrylate of bisphenol A-ethylene oxide addition product, and bisphenol A-propylene oxide addition product; monoacrylates or monomethacrylates of hydrogenated bisphenol A-alkylene oxide addition product, such as monoacrylate or monomethacrylate of hydrogenated bisphenol A ethylene oxide, and monoacrylate or monomethacrylate of hydrogenated bisphenol A-propylene oxide; compounds obtained by reacting a compound having epoxy groups with carboxyl group of unsaturated carboxylic acid, such as diacrylates or dimethacrylates of glycidyl ether of bisphenol A; urethane-modified acrylates or methacrylates obtained by reacting a diisocyanate compound with an alcoholic hydroxy group-containing compound, followed by reacting the resulting isocyanate-terminated compound with an alcoholic hydroxy group-containing acrylate or methacrylate; and compounds obtained by reacting a 5-membered hydroxy compound, such as tetrahydrofurfuryl acrylate or methacrylate, or dihydroxycyclopentadienyl acrylate or methacrylate with acrylic acid or methacrylic acid.

The radical-polymerization inhibitors employed in the practice of this invention are general purpose radical polymerization inhibitors. They react with radical quickly to form a stable radical or neutral substance. Examples of the radical polymerization inhibitors include organic compounds, such as diphenyl picryl hydrazyl, tri-p-nitrophenylmethyl, phenothiazine, benzoquinone, p-tert.-butylcatechol, hydroquinone, hydroquinone monoalkyl ethers, nitrobenzene, metal salts of dialkyl dithiocarbamic acids, oxygen and oxygen-containing gaseous substances. Preferably, the amount of the inhibitor employed may be in the range of 0.01–0.1% by weight on the basis of the total amount of the starting materials. It is preferable that oxygen or an oxygen-containing gaseous substance such as air is fed into the reaction system with the organic inhibitor. It is most preferable that the reaction is carried out while air is sparged into the reaction mixture.

By "photo-polymerization initiator or photo-sensitizer (d)" is meant a compound being capable of easily generating radical or ion when exposing it to radiation. Examples of initiators or sensitizers include azido compounds, such as azido benzene, 4-azido benzoic acid, 4,4'-diazido biphenyl, 1,2-bis(4-azidophenyl)ethylene, 4-aminophenyl-4'-azidophenylmethane, 4,4'-diazidobenzophenone, 2,6-bis(4-azidobenzyl) cyclohexane, and 4,4'-diazidoestilbene-2,2'-disulfonic acid sodium salt; carbonyl compounds, such as benzophenone, benzophenone oxime, benzoin, benzoin methyl ether, benzoin ethyl ether, benzoin isopropyl ether, acetophenone, α-haloketones, ω-bromoacetophenone, and cyclohexanone; sulfur compounds, such as diphenyl monosulfide, dibenzothiazyldisulfide, s-acyl-dithiocarbamate; azo compounds, such as m,m-azoxystyrene, and azoisobutyl nitrile; organic peroxides, such as benzoyl peroxide, and di-tert.-butyl peroxide; inorganic ions, such as $Fe^{3+}X_3{}^-$ and $Sb^{4+}Cl_4{}^-$; dialkyldithiocarbamate stearates, tert.-butyl anthraquinone; 2-mercaptobenzothiazol; 7-diethylamino-4-methylcumarin; diphenyl iodonium. The amount of the initiator or the sensitizer employed may be less than 10% by weight on the basis of the curable resin.

The heat-curing catalysts or curing agents promote heat cure of curable resin. Examples of the catalysts or curing agents (e) include imidazols, such as 2-methyl imidazol, 2-undecyl imidazol, 2-heptadecyl imidazol, 2-phenyl imidazol, 2-ethyl-4-methyl imidazol, 1-benzyl-2-methyl imidazol, 1-propyl-2-methyl imidazol, 1-cyanoethyl-2-methyl imidazol, 1-cyanoethyl-2-ethyl imidazol, 1-cyanoethyl-2-undecyl imidazol, 1-cyanoethyl-2-phenyl imidazol, 1-cyanoethyl-2-ethyl-4-methyl imidazol, and 1-guanaminoethyl-2-methyl imidazol; and the addition product of the imidazol and an organic acid or an acid anhydride; a tertiary amines, such as N,N-dimethyl benzylamine, N,N-dimethylaniline, N,N-dimethyl toluidine, N,N-dimethyl-p-anisidine, p-halogeno-N,N,-dimethylanilines, 2-N-ethylanilinoethanol, tri-n-butylamine, pyridine, quinoline, N-methyl morpholine, triethanolamine, triethylenediamine, N,N,N',N'-tetramethyl butanediamine, and N-methylpiperidine; phenols, such as phenol, xylenol, crezol, resorcinol, catechol, and fluoroglycine; organic metal salts, such as lead naphthenate, lead stearate, zinc naphthenate, zinc octoate, tin oleate, tin dibutylmaleate, manganese naphthenate, cobalt naphthenate, and iron acetylacetonate; inorganic metal salts, such as $SnCl_4$, $ZnCl_2$ and $AlCl_3$; peroxides, such as benzoyl peroxide, lauroyl peroxide, capril peroxide, acetyl peroxide, parachlorobenzoyl peroxide, and di-tert.-butyl-di-perphthalate; acid anhydrides, such as maleic anhydride, phthalic anhydride, lauryl anhydride, pyromellitic anhydride, trimellitic anhydride, hexahydro phthalic anhydride, hexahydro trimellitic anhydride, and hyxahydro pyromellitic anhydride; azo compounds, such as azo-bisisobutylnitrile; and curing catalysts for epoxy resins. The amount of the curing catalyst employed may be less than 10% by weight, and preferably less than 2% by weight on the basis of the total components.

The curable resins produced according to the present invention can be easily cured by means of heat, radiation (ultraviolet ray), heat+radiation and electron beam. The photo-curing is effected by exposing the curable resin to ultraviolet ray, such as a mercury vapor lamp.

The heat curing temperature depends on the presence or absence of a curing catalyst. In general, the temperature may be in the range of 100°–300° C.

The curable resin can be used as a coating composition, a molding product, a laminate, a tape, a film or a sheet.

A variety of the additives and reinforcing agents and fillers can be added to the curable resin as long as they do not impair the nature of the curable resin or the cured product. Examples of these additives include natural resins, such as rosin, shellac, copal, oil-modified rosin and the like; acrylate or methacrylate esters or prepolymers thereof, such as esters of a monofunctional or polyfunctional hydroxy compound and acrylic or methacrylic acid and alkenyl esters of acrylic or methacrylic acids; polyallyl compounds or prepolymers thereof, such as diallyl phthalate, divinyl benzene and trialkenyl isocyanurate; dicyclopentadiene or prepolymer thereof; cyanate ester resins; cyanate ester maleimide resins; maleimide resins; epoxy resins; phenol resins; polyvinyl acetal resins, such as polyvinyl formal, polyvinyl acetal and polyvinyl butyral; phenoxy resins; acrylic resins having OH group or COOH group; silicone resins; alkyd resins; petroleum resins; low molecular liquid - high molecular elastic rubbers, such as polybutadiene, butadiene-acrylonitrile copolymer, polychloroprene, butadiene-styrene copolymer, polyisoprene, butyl rubber and natural rubbers; vinyl polymers, such as polyethylene, polypropylene, polybutene, poly-4-methylpentene-1, polyvinyl chloride, polyvinylidene chloride, polystyrene, polyvinyl toluene, polyvinyl phenol, AS resin, ABS resin, MBS resin, polytetrafluoro ethylene, fluorinated ethylene-propylene copolymer, tetrafluoroethylene-hexafluoropropylene ethylene copolymer, polyfluorinated vinylidene; resins, such as polycarbonate, polyester carbonate, polyphenylene ether, polysulfone, polyester, polyether sulfone, polyamide, polyadomide, polyester imide, and polyphenylene sulfide.

A variety of reinforcing agents or fillers may be added to the curable resins of this invention. Examples of reinforcing agents or filler include glass cloths, such as cloth, roving cloth, chopped mat, and surfacing mat; inorganic fibers, such as silica glass cloth, carbon fiber cloth, asbestos, rockwool, and slag wool; synthesis fiber cloths, such as aromatic polyamide cloths, textile blends of glass fibers and aromatic polyamide fiber, acryl, vinylon, polyester, polyamide, and polyimide; natural or semi-synthesis fiber cloths or paper, such as cotton cloth, flax, felt, craft paper, cotton paper, paper composed of pulp and glass fibers, semi-carbon fibers; chops of fibers constituting these cloths or paper; and inorganic materials, such as glass bulb, glass powder, silica, alumina, silica alumina, aluminum hydroxide, asbestos, calcium carbonate, calcium silicate, graphitecarbon, carbon black, kaolin clay, baked kaolin, mica, talc, aluminum, copper, iron, iron oxides, synthesis mica, natural mica, semi-conductor, boron nitride, ceramics and the like.

Dye stuffs, pigments, thickeners, lubricants, coupling agents, flame-retardant, self-extinguishing agents, and the like may be added to the curable resin.

The present invention is further illustrated by the following non-limiting Examples and Control Runs.

All percentages and parts in these Examples and Control Runs are by weight, unless otherwise specified.

Example 1

In a glass vessel were charged 680 grams (g) of 2,2-bis(4-cyanatophenyl)propane (cyanato equivalent: 139), 170 g of 2-hydroxyethyl methacrylate (hereinafter is referred to as 2-HEMA) (hydroxy equivalent: 130) and 0.34 g of hydroquinone. The mixture was heated to 99.5°–102° C. while sparging air therein. The reaction was continued with stirring for 9.5 hours. The resulting reaction product was a uniform, viscous liquid at room temperature. Viscosity of the liquid was 2.6 poise at 75° C., and 500 poise at 25° C.

Example 2

In a glass vessel were charged 480 g of 2,2-bis(4-cyanatophenyl)propane, 360 g of 2-HEMA and 0.34 g of hydroquinone. The mixture was heated to 98°–102° C. while sparging air therein. The reaction was continued with stirring for 11.5 hours. The resulting reaction product was a uniform, viscous liquid at room temperature. Viscosity of the liquid was 2.6 poise at 75° C., and 410 poise at 25° C.

Control Run 1

The procedure of Example 1 was repeated except that the heating temperature was about 75° C. After the reaction was completed, the reaction mixture was cooled to room temperature. The resulting reaction product was crystalline, non-uniform liquid.

Control Run 2

40 g of 2,2-bis(4-cyanatophenyl)propane and 30 g of 2-HEMA were blended with stirring at 80° C. for 0.5 hours. The resulting reaction product was cooled to room temperature. The liquid was non-uniform and had crystals.

Control Run 3

40 g of prepolymer obtained by polymerizing 2,2-bis(4-cyanatophenyl)propane preliminarily at 160° C. for 3 hours and 30 g of 2-HEMA was blended at 80° C. for 0.5 hours to obtain uniform liquid.

Control Run 4

The procedure of Example 1 was repeated except that the heating temperature was about 145° C. The reaction was continued for 2 hours, the product geled. Uniform liquid was not formed.

Example 3

In a glass vessel were charged 680 g of 2,2-bis(4-cyanatophenyl)propane (cyanato equivalent: 139), 170 g of 2-hydroxypropyl methacrylate (hereinafter is referred to as HPMA) (hydroxy equivalent: 140) and 0.34 g of hydroquinone. The mixture was heated to 99°–102° C. while sparging air therein. The reaction was continued with stirring for 10.5 hours. The resulting reaction product was a uniform, viscous liquid at room temperature. Viscosity of the liquid was 2.6 poise at 75° C., and 510 poise at 25° C.

Example 4

480 G of 2,2-bis(4-cyanatophenyl)propane, 360 g of HPMA and 0.34 g of hydroquinone were charged into a glass vessel. The mixture was heated to 99°–102° C. while sparging air therein. The reaction was continued with stirring for 12.5 hours. The resulting reaction product was a uniform, viscous liquid at room temperature. Viscosity of the liquid was 2.6 poise at 75° C., and 420 poise at 25° C.

Pencil Hardness Test 1

Each of the reaction products obtained in Examples 1–4 and Control Runs 1–3 was treated in the following:

With the product was blended 5% by weight of tert.-butyl-peroxybenzoate. Each of the compositions was coated on glass epoxy reesin plate at a thickness of 50μ. Each of the resin plates was passed underneath two high pressure mercury vapor lamps of 80 W/cm at speed of 0.47–1.53 meter/minute.

Whether or not the resin was cured was observed and pencil hardness was measured. The results are shown in Table 1.

Pencil Hardness Test 2

Each of the reaction products obtained in Examples 1–4 and Control Runs 1–3 was treated in the following:

With the product was blended 5% by weight of tert.-butyl-peroxybenzoate. Each of the compositions was coated on glass epoxy resin plate at a thickness of 50μ. Each of the resin plates was passed underneath two high pressure mercury vapor lamps of 80 W/cm at speed of 0.6 meter/minute. Thereafter, each of the resin-coated plates was heated at 180° C. for 2 hours. The pencil hardness thereof was measured. The results are shown in Table 2.

Hot Solder Resistance Test

Each of the reaction products obtained in Examples 1–4 and Control Runs 1–3 was treated in the following:

With the product was blended 5% by weight of tert.-butyl-peroxybenzoate. Each of the compositions was coated on glass epoxy resin plate at a thickness of 50μ. Each of the resin plates was passed underneath two high pressure mercury vapor lamps of 80 W/cm at speed of 0.6 meter/minute.

Each of the plates was floated on melted solder at 260° C. for 10 minutes. The results are shown in Table 3.

TABLE 1

| Speed of resin-coated plate (m/min) | Pencil hardness | | | | | | |
| --- | --- | --- | --- | --- | --- | --- | --- |
| | 0.47 | 0.55 | 0.65 | 0.76 | 0.92 | 1.18 | 1.53 |
| Example 1 | 3H | 2H | 2H | 2H | 3B | 6B | — |
| Example 2 | 4H | 3H | 3H | 3H | 3H | 2B | — |
| Example 3 | 2H | 2H | 2H | 4B | — | — | — |
| Example 4 | 3H | 3H | 3H | 3B | 6B | — | — |
| Control Run 1 | Δ | Δ | X | X | X | X | X |
| Control Run 2 | Δ | Δ | X | X | X | X | X |
| Control Run 3 | 6B | — | — | — | — | Δ | Δ |

Note:
Symbols of "X" show that the resin composition is not cured, pencil hardness thereof can not be measured.
"—" not tested
"Δ" Though curing occurs, surface of the resin is tacky.

TABLE 2

| | Pencil hardness |
| --- | --- |
| Example 1 | 4H |
| Example 2 | 4H |
| Example 3 | 3H |
| Example 4 | 3H |
| Control Run 1 | HB |
| Control Run 2 | HB |
| Control Run 3 | HB |

TABLE 3

| | Hot solder resistance test |
| --- | --- |
| Example 1 | no damage |
| Example 2 | no damage |
| Example 3 | no damage |
| Example 4 | no damage |
| Control Run 1 | blisters |
| Control Run 2 | blisters |
| Control Run 3 | blisters |

Example 5

60 Parts of the reaction product prepared according to Example 1 was blended with 40 parts of bisphenol A type epoxy resin (epoxy equivalent: 450–500). The mixture was dissolved in methyl ethyl ketone. Gel time of the mixture was 15 minutes at 160° C.

To the mixture were added 0.2 parts of dicumyl peroxide, and 0.02 parts of zinc octoate. Gel time of the mixture was 240 seconds at 160° C.

Glass cloths were impregnated with the mixture and dried at 120° C. for 5 minutes so that resin content amounted to 43%, thereby obtaining prepreg. Gel time of the prepreg was 60 seconds at 170° C.

Eight sheets of this prepreg were stacked one on top of another and pressed at 40 kg/cm² and 150° C. for 6 hours to obtain laminate. Glass transition temperature of the laminate was 186° C.

What is claimed is:

1. A process for producing a curable resin which comprises reacting
    (a) at least one cyanate ester component selected from the group consisting of
        (i) a polyfunctional cyanate ester monomer having the formula:

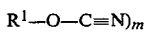

wherein m is an integer of 2 to 10 and $R^1$ is an aromatic organic group, the cyanate groups being directly bonded to the aromatic nucleus of said aromatic group,
        (ii) a prepolymer of (i), and
        (iii) a coprepolymer of (i) and an amine
    with (b) at least one compound having (1) at least one hydroxy group and (2) at least one radical polymerizable unsaturated double bond in its molecule
    in contact with (c) a radical polymerization inhibitor at a temperature of about 80°–about 140° C., wherein the ratio of the cyanate group to the hydroxy group is in the range of from about 1:0.1 to about 1:2.

2. The process as defined in claim 1 wherein compound (a) is 2,2-bis(4-cyanatophenyl)propane and compound (b) is 2-hydroxyethyl methacrylate or 2-hydroxypropyl methacrylate.

3. The process as defined in claim 1 wherein compound (a) is 1,4-dicyanato benzene and compound (b) is 2-hydroxyethyl methacrylate or 2-hydropropyl methacrylate.

4. The process as defined in claim 1 wherein the radical polymerization inhibitor is hydroquinone.

5. The process as defined in claim 1 wherein the reaction temperature is between 95° C. and 125° C.

6. The process as defined in claim 1 wherein air is sparged into the reaction mixture.

7. The process as defined in claim 1 wherein the ratio of the cyanato group to the hydroxy is in the range of from 1:0.2 to 1:1.

* * * * *